US010782347B2

(12) United States Patent
Meyer et al.

(10) Patent No.: US 10,782,347 B2
(45) Date of Patent: Sep. 22, 2020

(54) METHOD FOR IDENTIFYING A FAULT AT A DEVICE OUTPUT AND SYSTEM THEREFOR

(71) Applicant: NXP B.V., Eindhoven (NL)

(72) Inventors: Robert Meyer, Hamburg (DE); Michael Schoeneich, Hamburg (DE)

(73) Assignee: NXP B.V., Eindhoven (NL)

(*) Notice: Subject to any disclaimer, the term of this patent is extended or adjusted under 35 U.S.C. 154(b) by 114 days.

(21) Appl. No.: 15/790,178

(22) Filed: Oct. 23, 2017

(65) Prior Publication Data
US 2019/0120903 A1    Apr. 25, 2019

(51) Int. Cl.
G01R 31/28 (2006.01)
G01R 31/3185 (2006.01)
H01L 27/02 (2006.01)
G01R 31/30 (2006.01)
G01R 19/165 (2006.01)
G01R 31/317 (2006.01)
H03K 19/21 (2006.01)

(52) U.S. Cl.
CPC .......... *G01R 31/318594* (2013.01); *G01R 19/16528* (2013.01); *G01R 31/3004* (2013.01); *G01R 31/31716* (2013.01); *G01R 31/318541* (2013.01); *H01L 27/0255* (2013.01); *H03K 19/21* (2013.01)

(58) Field of Classification Search
CPC ........ G01R 31/3004; G01R 31/318541; G01R 31/318594; G05F 1/00; G06F 1/40; H01L 27/0255; H02H 3/08; H02M 3/158; H03K 19/21; H05B 37/02
See application file for complete search history.

(56) References Cited

U.S. PATENT DOCUMENTS

| | | | |
|---|---|---|---|
| 3,914,704 A | 10/1975 | Craft | |
| 4,271,447 A | 6/1981 | Howell | |
| 4,540,900 A | 9/1985 | Early et al. | |
| 4,760,285 A | 7/1988 | Nelson | |

(Continued)

FOREIGN PATENT DOCUMENTS

| | | |
|---|---|---|
| CN | 101202535 A | 6/2008 |
| CN | 10406297 A | 9/2014 |

(Continued)

OTHER PUBLICATIONS

Seno et al: "A 9-NS 16-MB CMOS SRAM With Offset-Compensated Current Sense Amplifier", IEEE Journal of Solid-State Circuits, vol. 28, No. 11, Nov. 1, 1993, 5 pages.

(Continued)

*Primary Examiner* — Albert Decady
*Assistant Examiner* — Enamul M Kabir

(57) ABSTRACT

A method includes receiving a first signal at an input of a device driver included at an electronic device, the first signal representing first information. A second signal representing the first information is provided at an output of the device driver. The output of the device driver, under normal operating conditions, is coupled to an output terminal of the electronic device. A third signal at the output terminal is received at feedback circuitry of the electronic device. The feedback circuitry identifies a fault at the output terminal based on the third signal and the first signal.

20 Claims, 6 Drawing Sheets

(56) References Cited

U.S. PATENT DOCUMENTS

| | | | |
|---|---|---|---|
| 4,879,523 A | 11/1989 | Cotreau | |
| 4,973,904 A | 11/1990 | Sonnek | |
| 5,473,283 A | 12/1995 | Luich | |
| 5,612,614 A | 3/1997 | Barrett, Jr. et al. | |
| 5,621,739 A | 4/1997 | Sine et al. | |
| 5,726,946 A * | 3/1998 | Yamagata | G11C 5/14 365/226 |
| 5,826,004 A | 10/1998 | Bae | |
| 5,847,561 A | 12/1998 | Whetsel et al. | |
| 6,477,674 B1 | 11/2002 | Bates et al. | |
| 6,629,274 B1 | 9/2003 | Trip et al. | |
| 7,168,021 B2 | 1/2007 | Chen | |
| 7,916,441 B2 * | 3/2011 | Bagarelli | H02H 7/0838 361/78 |
| 8,331,072 B1 * | 12/2012 | Liu | H03F 1/52 361/93.7 |
| 8,710,810 B1 * | 4/2014 | McJimsey | H02M 3/1584 323/272 |
| 8,933,634 B2 * | 1/2015 | Williams | H05B 45/46 315/186 |
| 2002/0024329 A1 | 2/2002 | Guthrie | |
| 2002/0140498 A1 | 10/2002 | Pernici et al. | |
| 2004/0090255 A1 | 5/2004 | Ajit | |
| 2004/0169980 A1 | 9/2004 | Amano et al. | |
| 2004/0193988 A1 * | 9/2004 | Saloio | G01D 3/08 714/742 |
| 2005/0077957 A1 | 4/2005 | Kasai et al. | |
| 2005/0275414 A1 | 12/2005 | Arigliano | |
| 2006/0290416 A1 | 12/2006 | Florescu | |
| 2007/0085596 A1 | 4/2007 | Ito | |
| 2007/0200545 A1 | 8/2007 | Loi et al. | |
| 2008/0158760 A1 * | 7/2008 | Moyer | H05B 41/2851 361/93.1 |
| 2008/0231313 A1 | 9/2008 | Miyazaki et al. | |
| 2009/0309563 A1 * | 12/2009 | Noda | H02M 3/158 323/282 |
| 2009/0309611 A1 | 12/2009 | Butler et al. | |
| 2010/0007999 A1 * | 1/2010 | Iwata | H02M 3/158 361/18 |
| 2010/0231301 A1 | 9/2010 | Bruin | |
| 2011/0215783 A1 | 9/2011 | Fukami et al. | |
| 2011/0221406 A1 | 9/2011 | Hong | |
| 2012/0013367 A1 * | 1/2012 | Chen | H02H 7/1213 327/87 |
| 2012/0049761 A1 * | 3/2012 | Yu | G09G 3/3406 315/294 |
| 2013/0057175 A1 * | 3/2013 | Chuang | H05B 45/395 315/240 |
| 2013/0207665 A1 * | 8/2013 | Bandyopadhyay | G01D 3/10 324/537 |
| 2013/0271095 A1 | 10/2013 | Jackum et al. | |
| 2013/0328540 A1 * | 12/2013 | Kung | H02M 3/158 323/311 |
| 2014/0043562 A1 * | 2/2014 | Kikuchi | H02M 3/156 349/61 |
| 2014/0089752 A1 | 3/2014 | Nelson et al. | |
| 2015/0103567 A1 * | 4/2015 | Wang | H02M 3/33592 363/21.13 |
| 2015/0241553 A1 | 8/2015 | Gehrels et al. | |
| 2015/0331040 A1 | 11/2015 | Bernon-Enjalbert et al. | |
| 2015/0369854 A1 * | 12/2015 | Mednik | G01R 31/2621 324/762.09 |
| 2016/0087422 A1 * | 3/2016 | Mourrier | H02H 7/0844 361/86 |
| 2016/0209854 A1 | 7/2016 | Yen et al. | |
| 2016/0231141 A1 | 8/2016 | Endres et al. | |
| 2016/0248390 A1 | 8/2016 | Issakov et al. | |
| 2017/0023959 A1 * | 1/2017 | Chen | H02M 3/158 |

FOREIGN PATENT DOCUMENTS

| | | |
|---|---|---|
| DE | 10144850 A1 | 4/2002 |
| EP | 0735687 A2 | 10/1996 |
| EP | 0735687 A3 | 10/1996 |
| EP | 0902298 A2 | 3/1999 |
| EP | 1806639 A1 | 7/2007 |
| JP | 2001111164 A | 4/2001 |
| JP | 2003283314 A | 10/2003 |

OTHER PUBLICATIONS

Charlon et al: "Ultra high-compliance CMOS current mirrors for low voltage charge pumps and references", Solid-State Circuits Conference, 2004, IEEE, Sep. 21, 2004, 4 pages.

Zhou et al: "An Ultra-Low Voltage Level Shifter Using Revised Wilson Current Mirror for Fast and Energy-Efficient Wide-Range Voltage Conversion from Sub-Threshold to I/O Voltage", IEEE Transactions on Circuits and Systems I: Regular Papers, vol. 62, No. 3, Mar. 2015, 10 pages.

Du et al., "Design of a synchronous boost DC-DC converter with constant current mode control in MPP", Analog Ex parte Quayle for U.S. Appl. No. 15/790,192 dated Mar. 11, 2019, 14 pages.

Notice of Allowance for U.S. Appl. No. 15/790,192 dated Aug. 9, 2019, 20 pages.

* cited by examiner

METHOD FOR IDENTIFYING A FAULT AT A DEVICE OUTPUT AND SYSTEM THEREFOR

CROSS-REFERENCE TO RELATED APPLICATION(S)

The present application is related to co-pending U.S. patent application Ser. No. 15/790,192, entitled "METHOD FOR IDENTIFYING A FAULT AT A DEVICE OUTPUT AND SYSTEM THEREFOR" filed on Oct. 23, 2017, the entirety of which is herein incorporated by reference.

FIELD OF THE DISCLOSURE

This disclosure relates generally to integrated circuits, and more particularly to identifying a fault at a device output.

BACKGROUND

An electronic system can include multiple devices, such as integrated circuits. An electronic device can include circuitry to interface with another device. For example, an integrated circuit can include an output terminal and an associated output driver for transmitting information to another integrated circuit. The information can be encoded and transmitted using a voltage or a current signal. For example, an output driver can include push-pull circuitry to provide a signal where the information to be transmitted is encoded using discrete voltage levels corresponding to a logic-high or a logic-low state. Alternatively, an output driver can selectively enabled to sink current provided by external pull-up circuitry, where particular levels of the sink current corresponding to individual logic states. Furthermore, an output driver can provide an analog interface, in which case the output driver provides a continuously range of voltage or current instead of discrete levels. Many failures that can occur within an electronic device can be detected using testing protocols and associated test circuitry. For example, the logic state of latch devices can be evaluated using test-scan technology. Other forms of built-in self-test can validate the operation of a functional block by providing diagnostic stimulus and evaluating how the functional block responds to the stimulus. Faults associated with output drive circuits can be difficult to identify, especially while the electronic system is functioning in its normal operating mode. Faults associated with an output driver can include defective transistors in the driver circuit, broken or shorted bonding wires, damaged cables or connectors that couple the output signal to the receiving device, failed electrostatic-discharge protection components, defective printed circuit board conductors, and the like. Undetected faults can have serious implications. For example, a fault in an automotive emergency braking system can result in a collision.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

FIGS. 1-7 illustrate techniques for detecting a fault condition at an output driver of an electronic system. Faults can include open circuit conditions and short circuit conditions. For example, a bond wire used to connect a terminal of an integrated circuit (IC) die to a corresponding IC package can fail, typically resulting in an open circuit condition. IC interfaces typically include electrostatic-discharge (ESD) devices that can fail creating a short circuit to a power or ground supply rail. In an automotive environment, the driving and receiving devices are likely coupled using cables and one or more electrical connectors, where a fault usually results in an open circuit condition. Techniques disclosed herein provide a feedback signal at an output driver that can be used to detect open circuit and short circuit faults, as well as faults that cause other anomalous load characteristics. For example, the feedback signal can monitor the transition time of an output signal and determine if the transition time is faster or slower than expected. The disclosed techniques can be utilized for either voltage or current based interfaces. While the techniques are described in the context of an interface between individual integrated circuits, the techniques can be utilized at any functional boundary, such as the interface of intellectual property (IP) blocks included at a system on chip (SOC) device.

Figure 1:
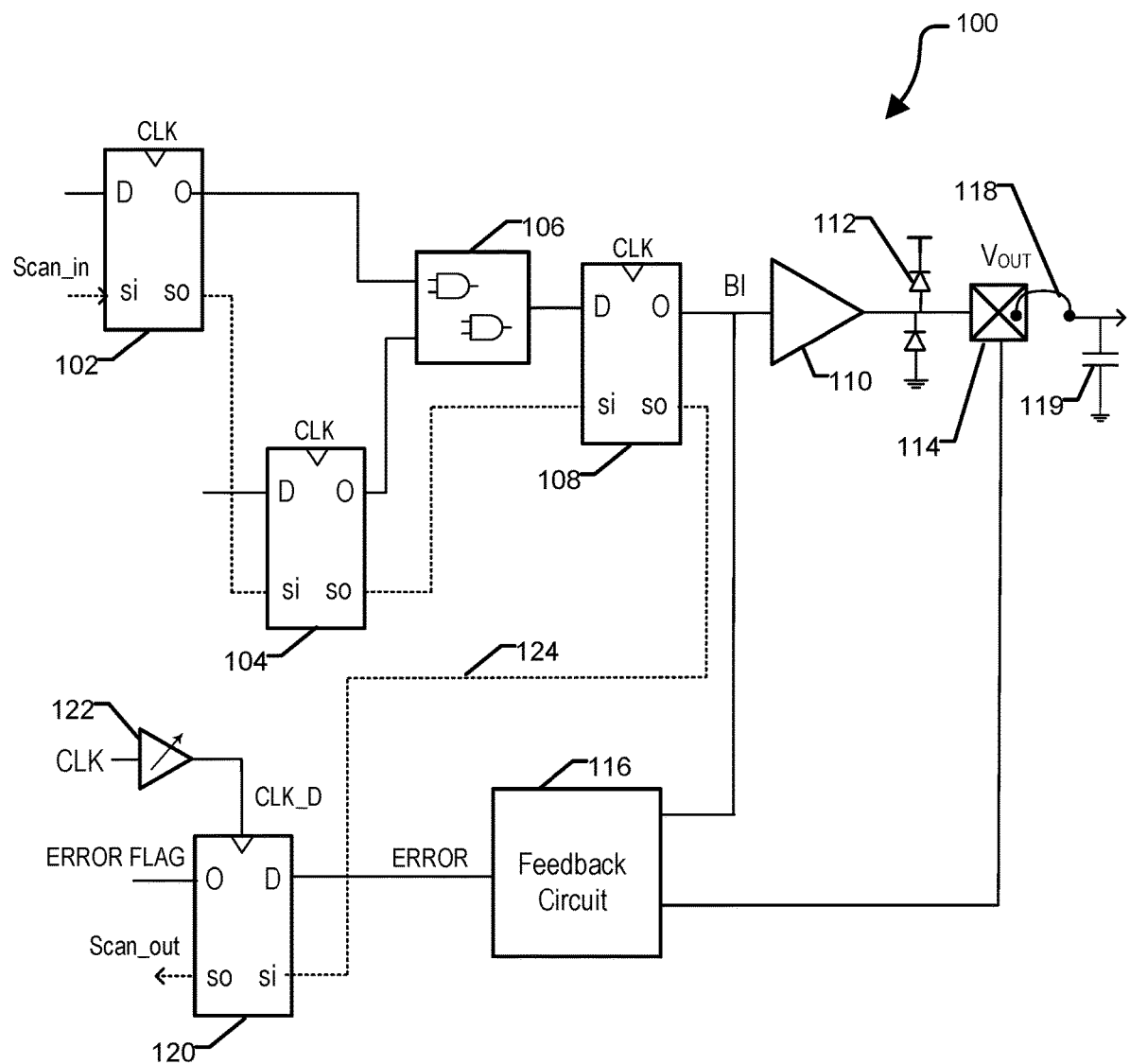
FIG. 1 is a schematic diagram illustrating output driver circuitry to detect a fault condition at a device interface according to a specific embodiment of the present disclosure.

FIG. 1 is a schematic diagram illustrating output driver circuitry 100 to detect a fault condition at a device interface according to a specific embodiment of the present disclosure. For example, output driver circuitry 100 can be included at an application-specific integrated circuit (ASIC) or at another type of electronic device. The output driver circuitry 100 includes an output driver 110, ESD protection devices 112, an output terminal 114 coupled to an output load 119 via a bond wire 118, feedback circuit 116, and an error flag latch 120. Also illustrated are latches 102, 104, and 108, and logic 106 that are included to represent portions of a functional block that generates state information represented by signal BI. Output driver 110 is configured to propagate the state information to terminal 114. Feedback circuit 116 includes a first input to receive signal BI from the input of output driver 110, a second input to receive a signal $V_{OUT}$ present at output terminal 114, and an output to provide a signal labeled ERROR. Error latch 120 includes an input to capture the logic state of signal ERROR and an output to provide signal ERROR FLAG.

Latches 102, 104, and 108 include a clock input terminal to receive a clock signal, CLK. Error flag latch 120 includes a clock input terminal that can be configured to receive clock signal CLK, however in the embodiment illustrated, the clock input terminal of error flag latch 120 receives a clock signal from delay circuit 122. Delay circuit 122 is configured to generate a delayed version of clock signal CLK, as described below. Latches 102, 104, 108, and error flag latch 120 are interconnected to provide a scan chain 124. Scan chain 124 provides a means to store and retrieve state information at each latch, including error information stored at error flag latch 120. Scan chain 124 includes an input labeled Scan_in, and an output labeled Scan_out.

During operation, state information encoded by signal BI is provided to an input terminal of output driver 110. State information can be represented by a logic-high voltage signal or a logic-low voltage signal. In an embodiment, output driver 110 is configured to communicate state information represented by signal BI to output terminal 114, also in the form of a logic-high voltage signal or a logic-low voltage signal. Output terminal 114 can be coupled to an input of another device, represented by output load capacitor 119 that is intended to receive the state information. Because a total capacitive load associated with terminal 114 and the receiving device can be greater than latch 108 is capable of driving, output driver 110 can include a buffer that provides greater drive capability. If there is not a fault associated with output terminal 114, signal $V_{OUT}$ will represent the same state information represented by signal BI that is provided to the input of output driver 110. However, if there is a fault associated with output terminal 114, signal $V_{OUT}$ can be corrupted. For example, signal $V_{OUT}$ can be stuck at a logic-low level, stuck at a logic-high level, fail to fully transition to a legal logic level, or transition from one logic state to another logic state to quickly or too slowly. Feedback circuit 116 is configured to identify these corruptions.

In another embodiment, output driver 110 can be configured to provide a current-based interface, often referred to as an open-collector interface. During operation, output driver 110 converts state information represented by signal BI as described above into a corresponding sink current. A pull-up resistor or a transistor-based current source, that can be included in the receiving device, is configured to elevate a voltage at terminal 114 unless countered by the sink current provided by output driver 110. For example, if signal BI is at a logic-low level, output driver 110 can be configured to sink a first amount of current, such as seven milliamps, and if signal BI is at a logic-high level, output driver 110 can be configured to sink a second amount of current, such as fourteen milliamps. The receiving device coupled to output terminal 114 can interpret the variation in sink current to represent the original state information represented by signal BI.

During operation, feedback circuit 116 is configured to identify one or more fault conditions associated with output terminal 114. If a fault condition is identified, feedback circuit 116 can assert signal Error, which can subsequently be latched by error flag latch 120. In particular, feedback circuit 116 is configured to compare a voltage level of signal BI at the input of output driver 110 with a voltage level of signal $V_{OUT}$ at the output of output driver 110. The voltage level of signal $V_{OUT}$ is influenced by the characteristics of output driver 110 and of the external load 119. For example, output driver 110 can be damaged, preventing state information BI from being properly propagated to the external load. For another example, ESD protection devices 112 can be damaged, resulting in a short circuit of signal $V_{OUT}$ to the power or ground nodes. Other circuit failures include a break in bond wire 118 or an open or short circuit in conductors at the device receiving signal $V_{OUT}$. Other circuit failures can result in the load impedance represented by external load 119 being too low or too high, which can result in kick-back noise, signal ringing, and the like. Feedback circuitry 116 can include error logic which may be adapted by the designer for special needs of error detection to provide functional safety. Because error flag latch 120 is configured within scan chain 124, an error identified by feedback circuit 116 can be detected by internal built-in self test circuitry. Operation of feedback circuit 116 can be better understood with reference to FIG. 2, below.

Figure 2:
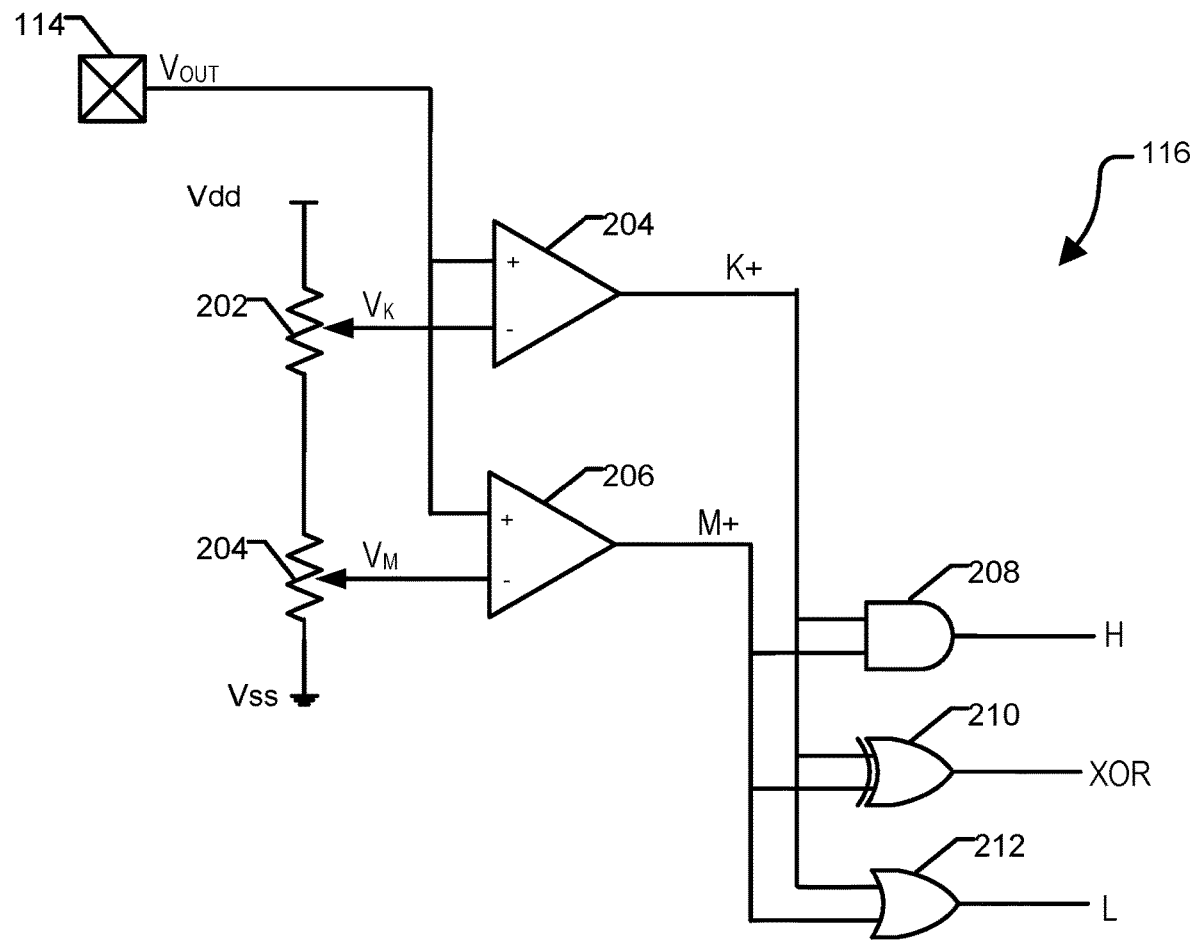
FIG. 2 is a schematic diagram illustrating feedback logic of FIG. 1 according to a specific embodiment of the present disclosure.
Figure 2:
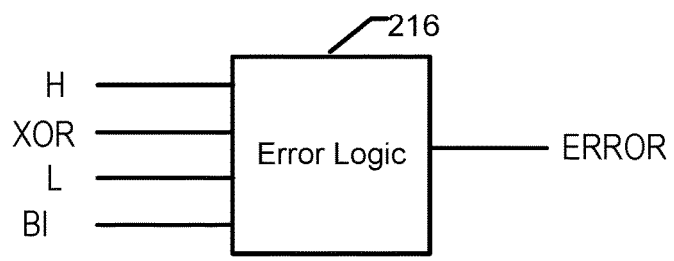

FIG. 2 is a schematic diagram illustrating feedback circuit 116 of FIG. 1 according to a specific embodiment of the present disclosure. Feedback circuit 116 includes a variable resistor 202, a variable resistor 204, a voltage comparator 204, a voltage comparator 206, logic gates 208, 210, and 212, and error logic 216. Logic gate 208 provides an AND function, logic gate 210 provides an XOR function, and logic gate 212 provides an OR function. Feedback circuit 116 receives signal $V_{OUT}$ from output terminal 114. Signal $V_{OUT}$ is connected to a non-inverting input of comparator 204 and to a non-inverting input of comparator 206. Variable resistors 202 and 204 are connected in series. A remaining terminal of variable resistor 202 is connected to a supply voltage reference, Vdd, and a remaining terminal of variable resistor 204 is connected to a ground voltage reference, Vss. A variable tap at resistor 202 is configured to provide a reference voltage $V_K$ to an inverting input of comparator 204, and a variable tap at resistor 204 is configured to provide a reference voltage $V_M$ to an inverting input of comparator 206. One of skill will appreciate that while variable resistors 202 and 204 are illustrated, voltage references $V_K$ and $V_M$ can be generated by other means, such as using one or more digital to analog converters, a band-gap voltage reference, and the like.

Comparator 204 has an output to generate signal K+, which is connected to a first input of logic gate 208, a first input of logic gate 210, and a first input of logic gate 212. Similarly, comparator 206 has an output to generate signal M+, which is connected to a second input of logic gate 208, a second input of logic gate 210, and a second input of logic gate 212. Logic gate 208 has an output to generate a signal, H, logic gate 210 has an output to generate a signal, XOR, and logic gate 212 has an output to generate signal, L. Error logic 216 includes a first input to receive signal H, a second input to receive signal XOR, a third input to receive signal L, a fourth input to receive signal BI, and an output to provide a signal, ERROR.

During operation, signal M+ is asserted if a voltage level of signal $V_{OUT}$ exceeds threshold voltage $V_M$ and signal K+ is asserted if a voltage level of signal $V_{OUT}$ exceeds threshold voltage $V_K$. For example, reference voltages $V_M$ and $V_K$ can be selected so that signal K+ is asserted if signal $V_{OUT}$ represents a valid logic-high level, and M+ is not asserted if signal $V_{OUT}$ represents a valid logic-low level. Signal H is asserted if both signals K+ and M+ are asserted, signal XOR is asserted only if signals K+ and M+ represent opposite logic states, and signal L is asserted if either signals K+ or M+ are asserted.

Error logic 216 is configured to determine that a fault is associated with output terminal 114. For example, if signals H, L, and XOR are each at a logic-low level, this can be indicative of a short circuit between terminal 114 and a ground reference voltage. If signals H and L are each at a logic-high level and signal XOR is at a logic-low level, this can be indicative of a short circuit between terminal 114 and a supply reference voltage. Signal XOR is asserted if a voltage level of signal $V_{OUT}$ is between the levels of reference voltages $V_M$ and $V_K$. Accordingly, if signal XOR is asserted, a duration (pulse width) of the assertion is representative of a transition time of signal $V_{OUT}$. In an embodiment, error logic 216 can determine whether the transition time of signal $V_{OUT}$ as indicated by signal XOR is less than a first predetermined value or greater than a second predetermined value. For example, if the transition time of signal $V_{OUT}$ is too fast, this can be indicative of an open circuit fault at terminal 114. If the transition time of signal $V_{OUT}$ is too slow, this can be indicative of excessive resistive or capacitive load at terminal 114. The duration of the assertion of signal XOR can be determined using a counter, and analog to digital converter, or another suitable technique. In an embodiment, error logic 216 can determine a propagation delay of output driver 110, which can be indicative of a fault. For example, error logic 216 can measure a period of time between the assertion or de-assertion of signal BI and a corresponding assertion/de-assertion of signal $V_{OUT}$.

Figure 3:
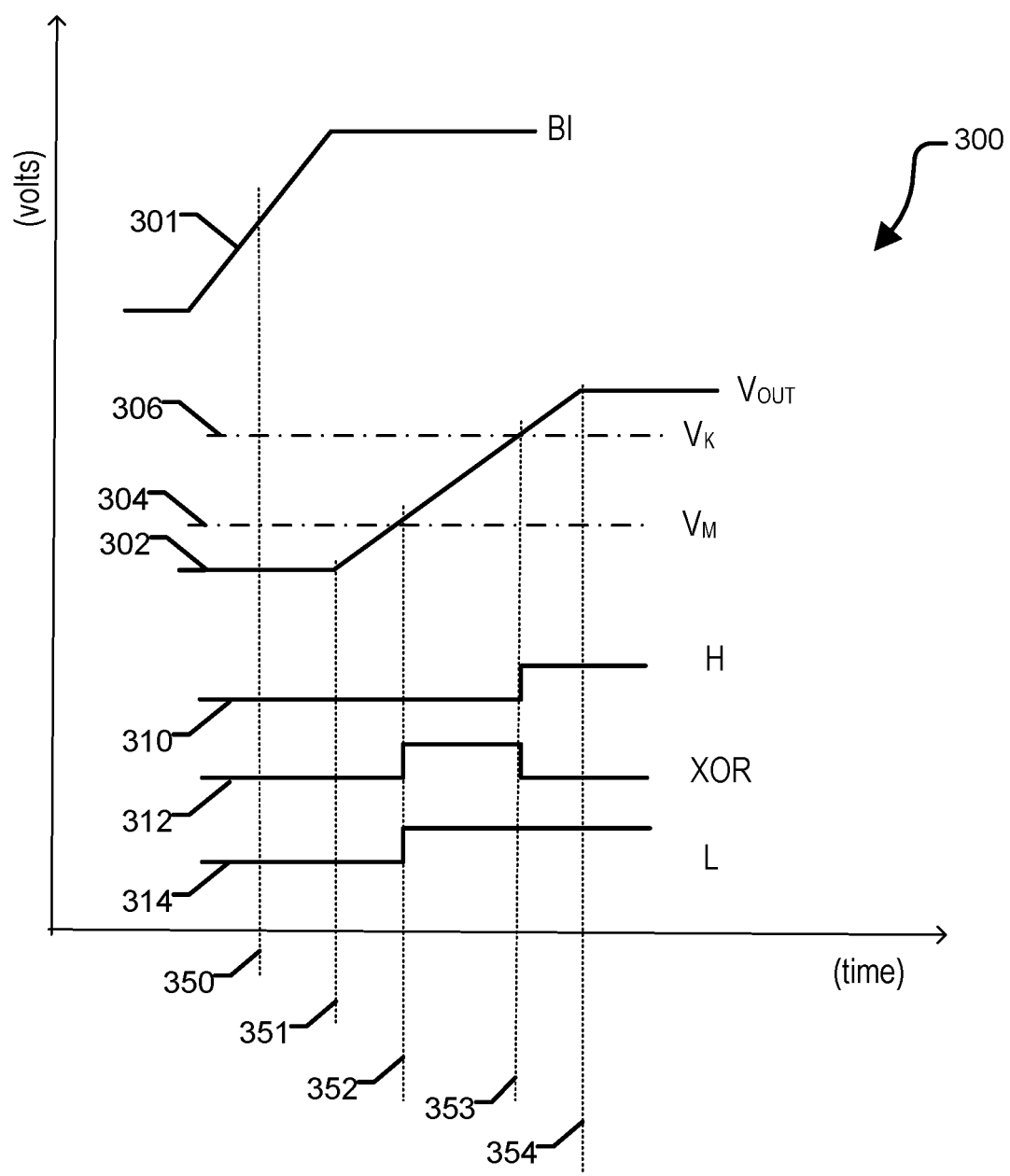
FIG. 3 is a timing diagram illustrating the operation of feedback circuit of FIGS. 1 and 2 according to a specific embodiment of the present disclosure.

FIG. 3 is a timing diagram 300 illustrating the operation of feedback circuit 116 of FIGS. 1 and 2 according to a specific embodiment of the present disclosure. Timing diagram 300 includes a horizontal axis representing time and a vertical axis representing voltage. Timing diagram 300 further includes waveform 301 representing signal BI, waveform 302 representing signal $V_{OUT}$; threshold voltage M, 304; threshold voltage K, 306; signal H, 310; signal XOR, 312; signal L, 314; and time references 350, 351, 352, 353, and 354. Waveform 301 illustrates a transition of signal BI from a logic low level to a logic high level. In response to the transition of signal BI, signal $V_{OUT}$ (waveform 302) begins transitioning at time reference 351 and completes transitioning at time reference 354. At time reference 352, a voltage level of signal $V_{OUT}$ has reached threshold voltage M 304; and at time reference 353, the voltage level of signal $V_{OUT}$ has reached threshold voltage K 306. The period of time from time reference 350 to time reference 352 can be referred to as the reaction delay of output driver 110, and the period of time from time reference 350 to time reference 353 can be referred to as the propagation delay of output driver 110. As described above, signal H is asserted by AND gate 208 at time reference 353 when a voltage level of signal $V_{OUT}$ exceeds threshold voltage K. Signal XOR is asserted at time reference 352 when the voltage level of signal $V_{OUT}$ exceeds threshold voltage M, and is de-asserted when the voltage level of signal $V_{OUT}$ further rises and exceeds threshold voltage K. Signal L is asserted when the voltage level of signal $V_{OUT}$ exceeds threshold voltage M. One of skill will appreciate that while waveform 302 is illustrated as a piece-wise-linear form, waveform 302 is like exponential in shape as would be expected when driving a load having resistance and capacitance characteristics. Furthermore, while output driver 110 and signal VOUT are described in the context of a digital logic interface, one of skill will be appreciated that compare logic 116 and the concepts described above can be applied to an analog interface.

Returning to FIG. 2, error logic 216 can assert signal ERROR if a fault associated with output terminal 114 is detected. As described above, signal ERROR can be latched by error flag latch 120 of FIG. 1. In an embodiment, a delay provided by delay circuit 122 can be adjusted to control when signal ERROR is latched at error flag latch 120. For example, delay circuit 122 can include selectable buffer delays, a delay-locked-loop, and the like, to delay the generation of signal CLK_D relative to signal CLK. A digital data processing device, such as an ASIC device, can include a clock circuit to generate one or more internal clock signals. For example, latch 108 includes an input to receive a clock signal, CLK, which controls the timing of signal BI. Output driver 110 and feedback circuit 116 each introduce delay. Signal ERROR is captured by latch 120 based on the delayed clock signal CLK_D. Accordingly, the propagation delay of signal $V_{OUT}$ relative to signal BI (and clock signal CLK) can be measured by adjusting the delay of clock signal CLK_D.

Figure 4:
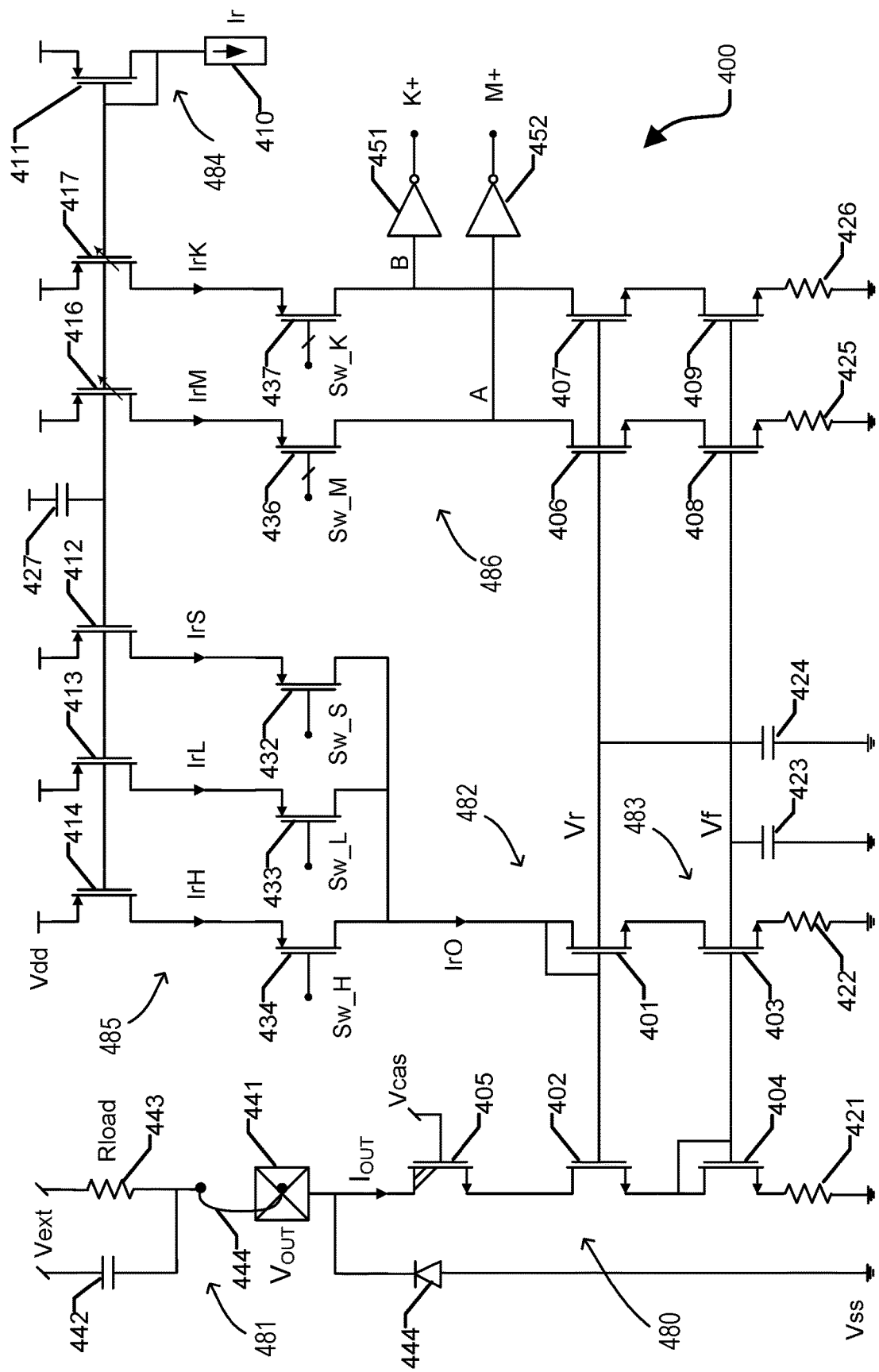
FIG. 4 is a schematic diagram illustrating an output driver circuit to detect a fault condition at a device interface that operates in a current domain, according to a specific aspect of the present disclosure.

FIG. 4 is a schematic diagram illustrating an output driver circuit 400 to detect a fault condition at a device interface that operates in a current domain, according to a specific aspect of the present disclosure. Similar to output driver circuit 100 of FIG. 1, output driver circuit 400 is configured to communicate information from an electronic device, which includes output driver circuit 400, to another device. The information is encoded using two or more discrete current sink values. For example, a first logic state can be represented by one particular sink current, while another logic state can be represented by a different sink current. A current is received at an output terminal 441 from a source that is external to driver circuit 400. For example, a current source can be provided by a pull-up resistor or transistor circuit included at the receiving device, or pull-up circuitry external to both the transmitting and receiving devices. Output driver circuit 400 is configured to selectively sink predefined current values corresponding to each of two or more logic states. The selective sink current and external current source, together, form a voltage divider. Accordingly, a voltage, $V_{OUT}$, at an output terminal 441 will vary depending on the amount of current sunk by output driver circuit 400. The sink current is labeled, $I_{OUT}$, at FIG. 4.

Output driver circuit 400 includes transistors 401, 402, 403, 404, 405, 406, 407, 408, 409, 411, 412, 413, 414, 416, 417, 432, 433, 434, 436, and 437; resistors 421, 422, 425, and 426; capacitors 423, 424, and 427; a current source 410; a diode 444; inverters 451 and 452; and the output terminal 441. The external current source and receiving device are represented by resistor 443, Rload, and parasitic capacitor 442, which are coupled to output driver circuit 400 via a bond wire 444 to output terminal 441. Resistor 443 and parasitic capacitor 442 are coupled to a power supply Vext, indicated by the diagonal supply symbol, that is associated with the device receiving information from output driver circuitry 100. Output driver circuit 400 is best described by partitioning the circuit into functional blocks. The functional blocks include a high voltage output circuit 481, a current sink mirror 482, a feedback current mirror 483, a reference current circuit 484, a current level switch 485, and a current comparator 486, which are described below.

Circuit 400 provides a current path 480 from the output terminal 441 to a ground reference voltage, Vss. Current path 480 conducts the selected sink current, $I_{OUT}$, and includes a series connection of current electrodes of transistors 405, 402, and 404. As used herein, current electrodes of a transistor include drain/source terminals of a field-effect transistor, collector/emitter terminals of a bipolar transistor, and the like. A gate or base terminal of a transistor is herein referred to as a control electrode. During operation, a voltage at the control electrode of transistor 402 determines how much current is permitted to flow in current path 480. For example, the control electrode of transistor 402 is used to selectively control the magnitude of a sink current provided at output terminal 441.

High voltage output circuit 481 includes output terminal 441, transistor 405, diode 444, capacitor 442, and resistor 443. Diode 444 represents an electrostatic discharge protection circuit. Output driver circuit 400 can support communication with a receiving device that operates at a supply voltage, Vext, that is greater than a supply voltage, Vdd, of the transmitting device that includes driver circuit 400. Accordingly, transistor 405 is a high voltage transistor configured to isolate transistors 402 and 404 from Vext. In particular, the drain of transistor 405 is fabricated to withstand the maximum specified external supply voltage Vext. In an embodiment, the control electrode of transistor 405 is coupled to a supply voltage, Vcas, that is greater than the supply voltage Vdd so that transistor 405 does not further limit the amount of current that can flow at current path 480. Supply voltage Vcas can be generated using a charge pump based on supply voltage Vdd.

Reference current circuit 484 includes current source 410 and transistor 411. Current source 410 provides a reference current, Ir, to a current electrode and a control electrode of transistor 411. Current source 410 can be external or internal to output driver 400, and can be provided by a bandgap circuit, or another type of current source. In an embodiment, current source 410 provides a small but highly accurate current, and can include features to support trimming the value of reference current Ir. For example, a current value provided by current source 410 can be regulated or calibrated using laser-trimming at the die level, fuse programming, programmable digital to analog converter circuitry, and the like. Transistor 411 is configured as a source device of a plurality of current mirrors. Transistor 412, 413, 414, 416, and 417 are each configured to mirror reference current Ir. A current mirror is a circuit configuration where a transistor is biased to conduct an amount of current that is proportional to a current conducted in another transistor. As used herein, the phrase mirroring a current conducted at a first transistor at a second transistor is intended to mean that the second transistor is biased to conduct a maximum current that is proportional to a current conducted at the first transistor. One of skill will appreciate that the actual current conducted at the second transistor may be less than the maximum value. As described below, each current mirror can be configured to provide gain, wherein the mirrored current is an integer or non-integer multiple of the reference current Ir.

Capacitor 427 is a fabricated capacitor to stabilize operation of the current mirror. For example, capacitor 427 can be a gate-oxide capacitor, a metal plate capacitor, and the like. Current level switch 485 includes transistor 412, 413, 414, 432, 433, and 434. Control electrodes of each of transistors 412, 413, and 414 are connected to the control electrode of transistor 411 so that a current at the drain terminals of each of transistors 412, 413, and 414 provides a current that mirrors reference current Ir. Furthermore, the effective width of transistors 412, 413, and 414 are configured to provide specific currents, IrH, IrL, and IrS, that are each a multiple of reference current Ir. For example, the effective width of transistor 412 can be three times the effective width of transistor 411 so that a value of current IrS is three times the value of reference current Ir; the effective width of transistor 413 can be seven times the effective width of transistor 411 so that a value of current IrL is seven times the value of reference current Ir; and the effective width of transistor 414 can be fourteen times the effective width of transistor 411 so that a value of current IrH is fourteen times the value of reference current Ir. One of skill will appreciate that other multiplicative values can be selected. Furthermore, while three mirror devices are illustrated, the current level switch can include as few as two mirror devices, or can include greater than three mirror devices.

The effective width of a transistor refers to the total current carrying capacity of the transistor, or plurality of transistors, when activated. The current carrying capacity of a transistor is determined based on a width and length of a channel formed when the transistor is activated. As used herein, an effective width of a transistor can be provided by fabricating a single transistor with a desired channel width, or by providing two or more transistor that provide a parallel path for current to travel. For example, an effective width of ten microns can be provided by a single transistor have a channel width of ten microns, by two transistors having a channel width of approximately five microns that are connected in parallel, and the like.

Transistors 432, 433, and 434 are configured as switches that can be activated by signals Sw_S, Sw_L, and Sw_H, respectively. During operation, one or more of transistors 432, 433, and 434 can be activated by asserting a corresponding one or more of signals Sw_S, Sw_L, and Sw_H to adjust a value of output current IrO that is generated by the current level switch. For example, based on the exemplary values described above, asserting signals Sw_S and Sw_L simultaneously would result in output current IrO having a value equal to the sum of currents IrS (3×Ir) and IrL (7×Ir), or ten times the value of reference current Ir. During operation, switches Sw_S, Sw_L, and Sw_H are activated and deactivated to control a sink current provided by output driver 400 at output terminal 441, the activation and deactivation determined based on state information being transmitted to the receiving device. For example, a logic-high state may correspond to a sink current corresponding to the assertion of signal Sw_H and a logic-low state may correspond to a sink current corresponding to the assertion of signal Sw_L. For another example, a logic-high state may correspond to a sink current corresponding to the assertion of signal Sw_H and signal Sw_L, and a logic-low state may correspond to a sink current corresponding to the assertion of signal Sw_L; or other switch configurations that provide discrete values of sink current at output terminal 441 that correspond to logic respective state values.

Current sink mirror 482 includes transistor 401 and transistor 402. The control electrode of transistor 401 is connected to the control electrode of transistor 402, and this circuit node is labeled Vr. During operation, current IrO selected by the current level switch 485 and conducted by transistor 401 is mirrored by transistor 402. In an embodiment, the effective width of transistor 402 is greater than the effective width of transistor 401 so that the mirrored current conducted by transistor 402 is an integer or non-integer multiple of current IrO. The ratio of the effective width of transistor 402 to the effective width of transistor 401, and accordingly the current gain provided by the current sink mirror, will be referred to herein as current gain J. In other words, transistor 402 is configured to conduct a current equal to J×IrO. For example, a current gain of ten can be provided by selecting an effective width of transistor 402 that is ten times the effective width of transistor 401. Providing gain at current sink mirror 482 reduces current consumption and associated power dissipation of current level switch 485, current comparator 486, and reference current circuit 484. The current gain J can be a fixed value by design. Alternatively, transistor 402 can be replaced with multiple output transistors and the gain J can be made adjustable by switches operable to select one or more of the output transistors. Capacitor 424 is a fabricated capacitor to stabilize operation of current sink mirror 482. For example, capacitor 424 can be a gate-oxide capacitor, a metal plate capacitor, and the like When output driver 400 and associated receiver circuitry is operating correctly, current, $I_{OUT}$, conducted by current path 480 provided by transistors 402, 404, and 405 is J×IrO, where current IrO is adjusted by the current level switch. However, if there is a fault associated with output terminal 441, current $I_{OUT}$ can be different than the desired value, J×IrO. For example, if an open circuit fault isolates output terminal 441 from the external pullup current source, e.g. if bond wire 444 is broken, Rload, current $I_{OUT}$ will be zero. Other faults can result in current $I_{OUT}$ being less than the desired value, J×IrO. Fault detection is described below in greater detail.

Feedback current mirror 483 is configured to monitor the actual current being conducted in current path 480. Feedback current mirror 483 includes transistor 404 and transistor 403, which together provide another current mirror. The control electrode of transistor 404 is connected to the control electrode of transistor 403, and this circuit node is labeled Vf. In particular, transistor 403 is configured to mirror a current conducted at transistor 404. In an embodiment, this feedback current mirror is configured to provide a current gain of 1/J. For example, the effective width of transistor 404 can be ten times the effective width of transistor 403. The effective width of transistor 404 can be the same as the effective width of transistor 402, and the effective width of transistor 403 can be the same as the effective width of transistor 401. Feedback current mirror 483 measures the actual current conducted at current path 480 and mirrors it back, by a current gain of 1/J, to current comparator 486. It is desired that feedback current mirror follow output current $I_{OUT}$ quickly, so parasitic gate capacitance 423 should be small. It is further desired that transistor 403 does not limit current IrO significantly. Resistors 421 and 422 are selected to provide a voltage drop of approximately one hundred millivolts. Accordingly, a resistance provided by resistor 421 is approximately one tenth the resistance provided by resistor 422.

Current comparator 486 is configured to compare the actual current $I_{OUT}$ conducted at current path 480 with the intended value, IrO×J. Current comparator 486 includes transistors 416, 417, 437, 437, 406, 407, 408, and 409. Current comparator 486 includes two controllable reference currents, IrM and IrK, which define current thresholds. Current comparator 486 is configured to compare current $I_{OUT}$/J (current $I_{OUT}$ divided by current gain J) with each reference current. Transistors 416 and 417 can represent two or more current mirror transistors that mirror reference current Ir. Transistors 436 and 437 can represent two or more switch transistors that are controlled to select corresponding current mirror transistors so as to provide the desired values of references currents IrM and IrK. In an embodiment, transistor 416, 417, 436, and 437 provide a current-based digital-to-analog converter that is similar to current level switch 485.

Control electrodes of transistors 406 and 407 are connected to node Vr and thus implement current mirrors, which mirror current IrO conducted by transistor 401. The effective width of transistors 406 and 407 can be the same as the effective width of transistor 401. Control electrodes of transistors 408 and 409 are connected to node Vf and thus implement current mirrors, which mirror current $I_{OUT}$ conducted by transistor 404. The effective width of transistors 408 and 409 can be the same as the effective width of transistor 403, and the impedance of resistor 425 and resistor 426 can be the same as the impedance of resistor 422.

During operation, a voltage at node A will correspond to a logic-low state if output current $I_{OUT}$/J is greater than current IrM, and node B will correspond to a logic-low state if current $I_{OUT}$/J is greater than current IrK. Inverters 452 and 451 invert the logic state at nodes A and B, respectively. Accordingly, output M+ will be asserted with a logic high level if output current $I_{OUT}$/J is greater than current IrM, and output K+ will be asserted with a logic high level if output current $I_{OUT}$/J is greater than current IrK. For example, a current threshold represented by current IrM can be selected to correspond to a value equal to ten percent of a maximum value of output current $I_{OUT}$/J, and a current threshold represented by current IrK can be selected to correspond to a value equal to ninety percent of a maximum value of output current $I_{OUT}$/J.

Figure 5:
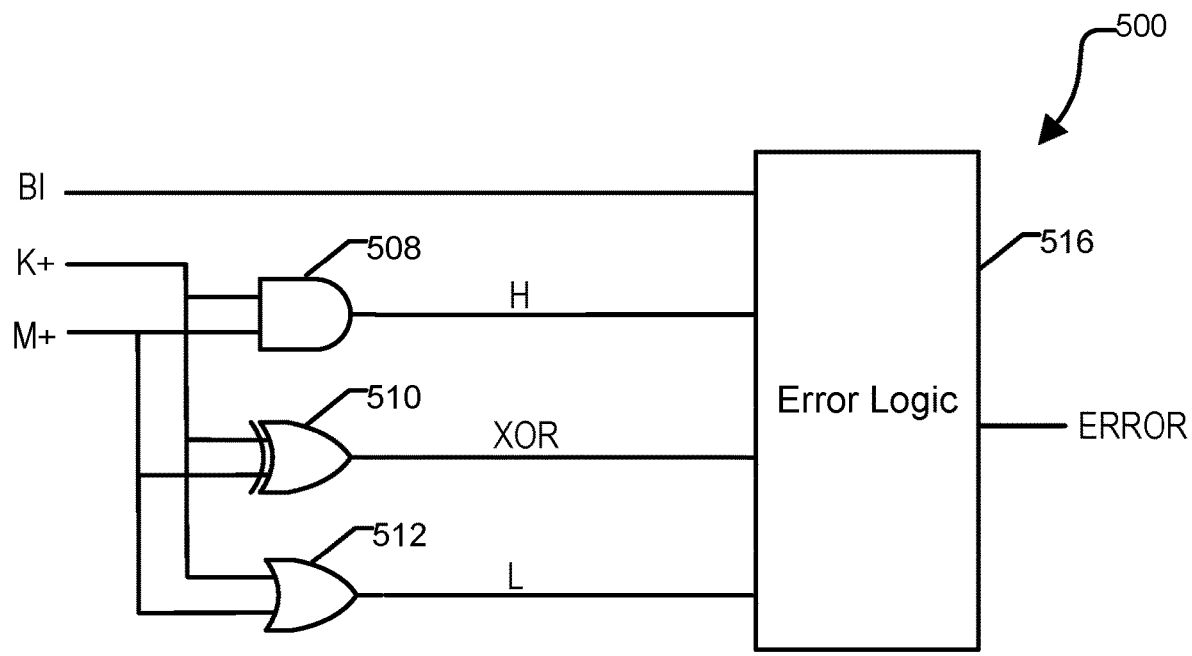
FIG. 5 is a schematic diagram illustrating fault detection logic according to a specific embodiment of the present disclosure.

FIG. 5 is a schematic diagram illustrating fault detection logic 500 according to a specific embodiment of the present disclosure. Fault detection logic 500 includes logic gates 508, 510, 512, and error logic 516. Operation of fault detection logic 500 is similar to operation of portions of feedback logic of FIG. 2. Fault detection logic 500 receives signals K+ and M+ from current comparator 486 of FIG. 4 and signal BI, and generates signal ERROR. Logic gates 508, 510, and 512 each have inputs to receive signals K+ and M+, and outputs to generate signals H, XOR, and L, respectively. Error logic 516 includes a first input to receive signal H, a second input to receive signal XOR, a third input to receive signal L, a fourth input to receive signal BI, and an output to provide a signal, ERROR. Signal BI represents an intended current sink value, as encoded by signal Sw_H, Sw_L, and Sw_S.

During operation, signal H is asserted if both signals K+ and M+ are asserted, signal XOR is asserted only if signals K+ and M+ represent opposite logic states, and signal L is asserted if either signals K+ or M+ are asserted. In an embodiment, error logic 516 can determine whether the transition time of signal $I_{OUT}$/J as indicated by signal XOR is less than a first predetermined value or greater than a second predetermined value. Fault detection logic 500 is configured to detect a fault associated with output terminal 441. For example, if output terminal is shorted to ground reference voltage Vss, or if there is an open circuit fault at output terminal 441, output current $I_{OUT}$ will be zero, and signals H, L, and XOR will each be at a logic-low level. If output driver circuit 400 is configured to sink a high current level, but a fault causes output current $I_{OUT}$/J to be less than a corresponding high current level represented by current IrK, signal H will not be asserted. If output terminal is shorted to external voltage Vext, the duration of an assertion of signal XOR will be less than expected, because the time constant associated with capacitor 442 and resistor 443 will be nearly zero.

Figure 6:
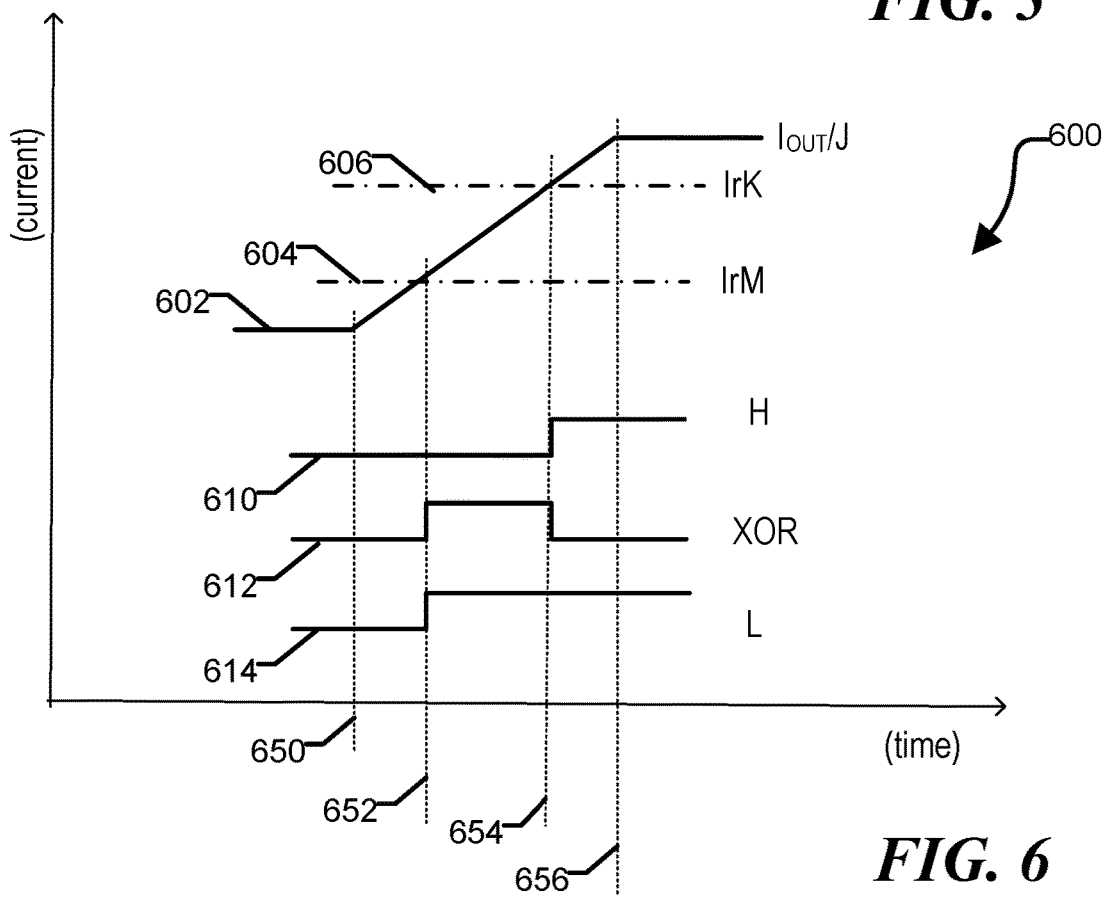
FIG. 6 is a timing diagram illustrating the operation of the output driver circuit of FIG. 4 and fault detection logic of FIG. 5 according to a specific embodiment of the present disclosure.

FIG. 6 is a timing diagram 600 illustrating the operation of the output driver circuit 400 of FIG. 4 and fault detection logic 500 of FIG. 5 according to a specific embodiment of the present disclosure. Timing diagram 600 includes a horizontal axis representing time and a vertical axis representing current. Timing diagram 600 further includes waveform 602 representing current $I_{OUT}$/J; threshold current IrM, 604; threshold current IrK, 606; signal H, 610; signal XOR, 612; signal L, 614; and time references 650, 652, 654, and 656. Waveform 602 illustrates a transition of current $I_{OUT}$/J from a current level representing logic low level, such as IrL, to a current representing a logic high level, such as IrH. Waveform 602 begins transitioning at time reference 650 and completes transitioning at time reference 656. At time reference 652, current $I_{OUT}/J$ has reached threshold current IrM, 604; and at time reference 654, current $I_{OUT}/J$ has reached threshold current IrK, 606. As described above, signal H is asserted by AND gate 508 at time reference 654 when current $I_{OUT}/J$ exceeds threshold current IrK. Signal XOR is asserted at time reference 652 when current $I_{OUT}/J$ exceeds threshold current IrM, and is de-asserted when the current $I_{OUT}/J$ further rises and exceeds threshold current IrK. Signal L is asserted when current $I_{OUT}/J$ exceeds threshold current IrM. One of skill will appreciate that while waveform 602 is illustrated as a piece-wise-linear form, waveform 602 is likely exponential in shape as would be expected when driving a load having resistance and capacitance characteristics. Furthermore, while output driver 400 and signals $V_{OUT}$ and $I_{OUT}$ are described in the context of a digital logic interface, one of skill will appreciated that fault detection logic 500 and the concepts described above can be applied to an analog current interface.

Figure 7:
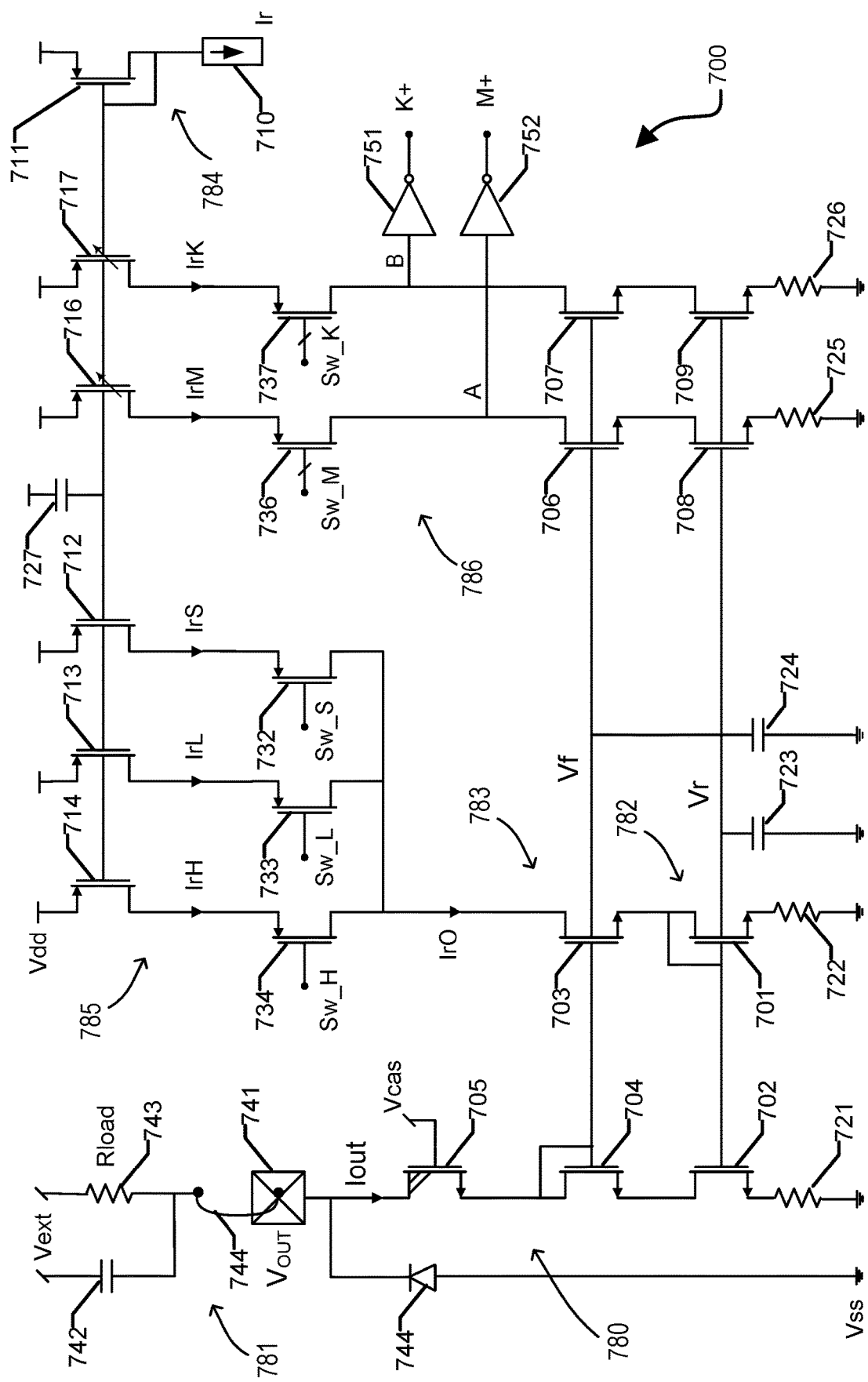
FIG. 7 is a schematic diagram illustrating an output driver circuit to detect a fault condition at a device interface that operates in a current domain, according to another aspect of the present disclosure.

FIG. 7 is a schematic diagram illustrating an output driver circuit 700 to detect a fault condition at a device interface that operates in a current domain, according to another aspect of the present disclosure. Output driver circuit 700 is substantially similar to output driver circuit 400 with one exception. Each reference number, 7xx, of FIG. 7 corresponds to the similarly numbered references, 4xx, of FIG. 4. For example, capacitor 442 of FIG. 4 corresponds to capacitor 742 of FIG. 7. Furthermore, the operation of the functional blocks of output driver circuit 700 is substantially the same as the operation of the functional blocks of output driver circuit 400. Accordingly, reference numbers of FIG. 7 that do not appear below correspond to elements of FIG. 4 that function substantially the same as described above with reference to FIG. 4. The difference between circuit 700 and circuit 400 is the configuration of the current sink mirror 782 and feedback current mirror 783. Specifically, the series connected order of transistors 704 and 702 of a current path 780 are switched relative to the series connected order of transistors 402 and 404 of current path 480 of FIG. 4. The series connected order of transistors 703 and 701 are similarly reversed relative to transistor 401 and 403. Output driver circuit 400 uses a Wilson current mirror that generates a voltage drop of greater than two threshold voltages of transistor 401 and transistor 403. Accordingly, output driver circuit 400 requires a supply voltage that is greater than approximately 1.8 v for some integrated circuit process technologies. Instead, output driver circuit 700 uses a cascode current mirror that generates a voltage drop that is less than that of circuit 400. Therefore, circuit 700 can operate using a supply voltage that is lower than that required by circuit 400, for a particular process technology.

Current sink mirror 782 includes transistor 701 and transistor 702. The control electrode of transistor 701 is connected to the control electrode of transistor 702, and this circuit node is labeled Vr. During operation, current IrO selected by current level switch 785 and conducted by transistor 701, is mirrored by transistor 702. In an embodiment, the effective width of transistor 702 is greater than the effective width of transistor 701 so that the mirrored current conducted by transistor 702 is an integer or non-integer multiple of current IrO. The ratio of the effective width of transistor 702 to the effective width of transistor 701, and accordingly the current gain provided by current sink mirror 782, will be referred to herein as current gain J. In other words, transistor 702 is configured to conduct a current equal to J×IrO. Capacitor 724 is a fabricated capacitor to stabilize operation of current sink mirror 782. For example, capacitor 724 can be a gate-oxide capacitor, a metal plate capacitor, and the like Feedback current mirror 783 is configured to monitor the actual current being conducted in current path 780. Feedback current mirror 783 includes transistor 704 and transistor 703, which together provide another current mirror. The control electrode of transistor 704 is connected to the control electrode of transistor 703, and this circuit node is labeled Vf. In particular, transistor 703 is configured to mirror a current conducted at transistor 704. Transistor 703 is in a cascode configuration. In an embodiment, this feedback current mirror is configured to provide a current gain of 1/J. For example, the effective width of transistor 704 can be J times the effective width of transistors 706 and 707 of current comparator 786. The effective width of transistor 704 can be the same as the effective width of transistor 702, and the effective width of transistor 703 can be the same as the effective width of transistor 701. It is desired that feedback current mirror follow output current $I_{OUT}$ quickly, so parasitic gate capacitance 723 should be small. It is further desired that transistor 703 not limit current IrO significantly. Resistors 721 and 722 are selected to provide a voltage drop of approximately one hundred millivolts. Accordingly, a resistance provided by resistor 721 should be approximately one tenth the resistance provided by resistor 722.

In a first aspect, a device includes an output terminal; a driver including an input and an output, the driver configured to receive at the input a first signal representing first information and to provide at the output a second signal representing the first information, the output coupled to the output terminal; and a feedback circuit to receive a third signal from the output terminal; identify a fault at the output terminal based on the third signal and the first signal; and generate an error indicator in response to identifying the fault. In an embodiment of the first aspect, the feedback circuit is further to store the error indicator at a latch, the latch included at a scan path, the scan path to communicate the error indicator to test logic. In another embodiment of the first aspect, the feedback circuit is further to receive the first signal; compare a logic state of the first signal with a logic state of the third signal; and identify the fault based on the comparison. In yet another embodiment of the first aspect, the feedback circuit further includes a first comparator to generate a first indicator in response to determining that a voltage level of the third signal exceeds a first threshold voltage; and a second comparator to generate a second indicator in response to determining that the voltage level of the third signal exceeds a second threshold voltage.

In an embodiment of the first aspect, the feedback circuit is further to determine a first transition time of the third signal based on the first indicator and the second indicator; and identify the fault based on the first transition time. In another embodiment of the first aspect, the feedback circuit is further to identify the fault in response to determining that the first transition time is less than a first predetermined value, the fault corresponding to a load impedance at the output terminal that is greater than an expected load impedance. In yet another embodiment of the first aspect, the feedback circuit is further to identify the fault in response to determining that the first transition time is greater than a second predetermined value, the fault corresponding to a load impedance at the output terminal that is less than an expected load impedance. In still another embodiment of the first aspect, the feedback circuit is further to receive the first signal; and identify the fault in response to determining that a propagation delay of the third signal relative to the first signal exceeds a predetermined propagation value. In another embodiment of the first aspect, the fault is selected from a group consisting of a short circuit between the output terminal and an external reference voltage; a short circuit between the output terminal and an external logic signal; a malfunction of an electrostatic discharge protection circuit; and an open circuit between the driver and a receiver external to the device. In still another embodiment of the first aspect, the feedback circuit is further to identify the fault while the device is functioning in a normal operating mode, the normal operating exclusive of a test mode.

In a second aspect, a method includes receiving a first signal at an input of a device driver included at an electronic device, the first signal representing first information; providing a second signal representing the first information at an output of the device driver, the output of the device driver, under normal operating conditions, coupled to an output terminal of the electronic device; receiving, at feedback circuitry of the electronic device, a third signal at the output terminal; and identifying, at the feedback circuitry, a fault at the output terminal based on the third signal and the first signal. In an embodiment of the second aspect, the method includes comparing, at the feedback circuitry, the first signal to the third signal; and identifying a fault at the output terminal based on the third signal. In another embodiment of the second aspect, the method includes generating, at the feedback circuitry, an error indicator in response to identifying the fault; and storing the error indicator a latch, the latch included at a scan path, the scan path for communicating the error indicator to test circuitry. In yet another embodiment of the second aspect, the method includes generating a first indicator in response to determining at a first comparator of the feedback circuitry that a voltage level of the third signal exceeds a first threshold voltage; and generating a second indicator in response to determining at a second comparator of the feedback circuitry that a voltage level of the third signal exceeds a second threshold voltage.

In still another embodiment of the second aspect, the method includes determining a first transition time of the third signal based on the first indicator and the second indicator; and identifying the fault based on the first transition time. In still another embodiment of the second aspect, the method includes identifying the fault in response to determining that the first transition time is less than a first predetermined value, the fault corresponding to a load impedance at the output terminal that is greater than an expected load impedance. In another embodiment of the second aspect, the method includes identifying the fault in response to determining that the first transition time is greater than a second predetermined value, the fault corresponding to a load impedance at the output terminal that is less than an expected load impedance. In yet another embodiment of the second aspect, the method includes receiving, at the feedback circuitry, the first signal; and identifying the fault in response to determining that a propagation delay of the third signal relative to the first signal exceeds a predetermined propagation value. In still another embodiment of the second aspect, the method includes identifying the fault while the electronic device is functioning in a normal operating mode that is exclusive of test operating mode.

In a third aspect, an automotive control system includes an electronic device having an output terminal; a driver at the electronic device, the driver including an input and an output, the driver configured to receive at the input a first signal representing first information and to provide at the output a second signal representing the first information, the output coupled to the output terminal; and a feedback circuit at the first electronic device. The feedback circuit receives a third signal from the output terminal; and identifies a fault at the output terminal based on the third signal and the first signal.

The preceding description in combination with the Figures was provided to assist in understanding the teachings disclosed herein. The discussion focused on specific implementations and embodiments of the teachings. This focus was provided to assist in describing the teachings, and should not be interpreted as a limitation on the scope or applicability of the teachings. However, other teachings can certainly be used in this application. The teachings can also be used in other applications, and with several different types of architectures.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A device comprising:
an output terminal;
a driver including an input and an output, the driver configured to receive at the input a first signal representing first information and to provide at the output a second signal representing the first information, the output coupled to the output terminal; and an error detection circuit configured to:
receive a third signal from the output terminal and receive the first signal from the input of the driver;
identify a fault at the output terminal based on the third signal and the first signal; and
generate an error indicator in response to identification of the fault.

2. The device of claim 1, wherein the error detection circuit is further configured to:
store the error indicator at a latch, the latch included at a scan path, the scan path configured to communicate the error indicator to test logic.

3. The device of claim 1, wherein the error detection circuit is further configured to:
compare a logic state of the first signal with a logic state of the third signal; and
identify the fault based on the comparison.

4. The device of claim 1, wherein the error detection circuit further comprises:
a first comparator to generate a first indicator in response to a determination that a voltage level of the third signal exceeds a first threshold voltage; and
a second comparator to generate a second indicator in response to a determination that the voltage level of the third signal exceeds a second threshold voltage.

5. The device of claim 4, wherein the error detection circuit is further configured to:
determine a first transition time of the third signal based on the first indicator and the second indicator; and
identify the fault based on the first transition time.

6. The device of claim 5, wherein the error detection circuit is further configured to:
identify the fault in response to a determination that the first transition time is less than a first predetermined value, wherein the fault corresponds to a load impedance at the output terminal that is greater than an expected load impedance.

7. The device of claim 5, wherein the error detection circuit is further configured to:
identify the fault in response to a determination that the first transition time is greater than a second predetermined value, wherein the fault corresponds to a load impedance at the output terminal that is less than an expected load impedance.

8. The device of claim 1, wherein the error detection circuit is further configured to:
identify the fault in response to a determination that a propagation delay of the third signal relative to the first signal exceeds a predetermined propagation value.

9. The device of claim 1, wherein the fault is selected from a group consisting of:
a short circuit between the output terminal and an external reference voltage;
a short circuit between the output terminal and an external logic signal;
a malfunction of an electrostatic discharge protection circuit; and
an open circuit between the driver and a receiver external to the device.

10. The device of claim 1, where in the error detection circuit is further configured to identify the fault while the device is functioning in a normal operating mode, the normal operating mode exclusive of a test mode.

11. The device of claim 1, wherein the error detection circuit further comprises:

a first comparator configured to receive the third signal and a first threshold voltage and output a first intermediate signal;
a second comparator configured to receive the third signal and a second threshold voltage less than the first threshold voltage, and output a second intermediate signal;
an AND logic gate configured to receive the first and second intermediate signals and output a first logic signal;
an XOR logic gate configured to receive the first and second intermediate signals and output a second logic signal;
an OR logic gate configured to receive the first and second intermediate signals and output a third logic signal; and
an error logic circuit configured to receive the first, second, and third logic signals and the first signal from the input of the driver, and output an error signal that indicates the error indicator when the fault associated with the output terminal is identified.

12. A method comprising:
receiving a first signal at an input of a device driver included at an electronic device, the first signal representing first information;
providing a second signal representing the first information at an output of the device driver, the output of the device driver, under normal operating conditions, coupled to an output terminal of the electronic device;
receiving, at error detection circuitry of the electronic device, a third signal at the output terminal and the first signal from the input of the device driver; and
identifying, at the error detection circuitry, a fault at the output terminal based on the third signal and the first signal.

13. The method of claim 12, further comprising:
comparing, at the error detection circuitry, the first signal to the third signal; and
identifying a fault at the output terminal based on the comparing.

14. The method of claim 12, further comprising:
generating, at the error detection circuitry, an error indicator in response to identifying the fault; and
storing the error indicator in a latch, the latch included at a scan path, the scan path for communicating the error indicator to test circuitry.

15. The method of claim 12, further comprising:
generating a first indicator in response to determining at a first comparator of the error detection circuitry that a voltage level of the third signal exceeds a first threshold voltage; and
generating a second indicator in response to determining at a second comparator of the error detection circuitry that a voltage level of the third signal exceeds a second threshold voltage.

16. The method of claim 15, further comprising:
a first transition time of the third signal based on the first indicator and the second indicator; and
identifying the fault based on the first transition time.

17. The method of claim 16, further comprising:
identifying the fault in response to determining that the first transition time is less than a first predetermined value, the fault corresponding to a load impedance at the output terminal that is greater than an expected load impedance.

18. The method of claim 16, further comprising:
identifying the fault in response to determining that the first transition time is greater than a second predetermined value, the fault corresponding to a load impedance at the output terminal that is less than an expected load impedance.

19. The method of claim 12, further comprising:

identifying the fault in response to determining that a propagation delay of the third signal relative to the first signal exceeds a predetermined propagation value.

20. An automotive control system comprising:

an electronic device having an output terminal;

a driver at the electronic device, the driver including an input and an output, the driver configured to receive at the input a first signal representing first information and to provide at the output a second signal representing the first information, the output coupled to the output terminal; and an error detection circuit at the first electronic device configured to:
- receive a third signal from the output terminal and receive the first signal from the input of the driver; and
- identify a fault at the output terminal based on the third signal and the first signal.

\* \* \* \* \*